United States Patent [19]

Ozawa

[11] Patent Number: 5,563,081
[45] Date of Patent: Oct. 8, 1996

[54] METHOD FOR MAKING A NONVOLATILE MEMORY DEVICE UTILIZING A FIELD EFFECT TRANSISTOR HAVING A FERROELECTRIC GATE FILM

[75] Inventor: Takanori Ozawa, Ukyo-ku, Japan

[73] Assignee: Rohm Co., Inc., Kyoto, Japan

[21] Appl. No.: 561,324

[22] Filed: Nov. 21, 1995

Related U.S. Application Data

[60] Continuation-in-part of Ser. No. 291,827, Aug. 17, 1994, abandoned, which is a division of Ser. No. 34,699, Mar. 19, 1993, Pat. No. 5,361,225.

[30] Foreign Application Priority Data

Mar. 23, 1992 [JP] Japan ....................... 4-65245

[51] Int. Cl.⁶ ............................... H01L 21/8239
[52] U.S. Cl. ........................ 437/41; 437/179; 437/904; 437/52; 148/DIG. 139; 148/DIG. 140
[58] Field of Search ............... 437/41 GS, 43, 437/52, 179, 904; 148/DIG. 139, DIG. 140

[56] References Cited

U.S. PATENT DOCUMENTS

| | | |
|---|---|---|
| 3,832,700 | 8/1974 | Wu et al. . |
| 4,376,984 | 3/1983 | Fukushima et al. . |
| 4,431,305 | 2/1984 | Malaviya . |
| 4,893,272 | 1/1990 | Eaton, Jr. et al. . |
| 5,032,891 | 7/1991 | Takagi et al. . |
| 5,198,994 | 3/1993 | Natori . |
| 5,229,309 | 7/1993 | Kato . |
| 5,345,415 | 9/1994 | Nakao et al. . |

FOREIGN PATENT DOCUMENTS 2-263386  10/1990  Japan .

OTHER PUBLICATIONS

Nikkei Microdevices, Jan. 1992, p. 84.

*Primary Examiner*—Mary Wilczewski
*Assistant Examiner*—Richard A. Booth
*Attorney, Agent, or Firm*—Law Office of Steven M. Rabin, P.C.

[57] ABSTRACT

A method for making a nonvolatile memory device having a field effect transistor for storing information, and a Schottky diode in series with the field effect transistor. The field effect transistor includes source and drain regions in a semiconductor substrate, with a channel region interposed between them and a gate electrode above the channel region. A ferroelectric gate film is sandwiched between the channel region and the gate electrode. In the method, a conductive barrier meterial is deposited in contact with the source region of the field effect transistor to make the Schottky diode. In reading information from the memory device, voltage is applied to a serial circuit consisting of the field effect transistor and the Schottky diode to turn the Schottky diode on.

9 Claims, 12 Drawing Sheets

METHOD FOR MAKING A NONVOLATILE MEMORY DEVICE UTILIZING A FIELD EFFECT TRANSISTOR HAVING A FERROELECTRIC GATE FILM

CROSS-REFERENCE TO RELATED APPLICATIONS

This application is a continuation-in-part of U.S. application Ser. No. 08/291,827, filed Aug. 17, 1994 now abandoned, which is a division of U.S. application Ser. No. 08/034,699, filed Mar. 19, 1993, now U.S. Pat. No. 5,361,225. The disclosures of these earlier applications are incorporated herein by reference.

BACKGROUND OF THE INVENTION

1. Field of the Invention

The present invention relates to a method for manufacturing a nonvolatile memory device which utilizes a residual polarization in ferroelectric material to store information in a nonvolatile manner.

2. Description of the Related Art

It has been proposed that an MFSFET (Metal Ferroelectric Semiconductor Field Effect Transistor), which is a kind of field effect transistor having a ferroelectric gate film, should be used in designing and fabricating a nonvolatile memory device.

Figure 4:
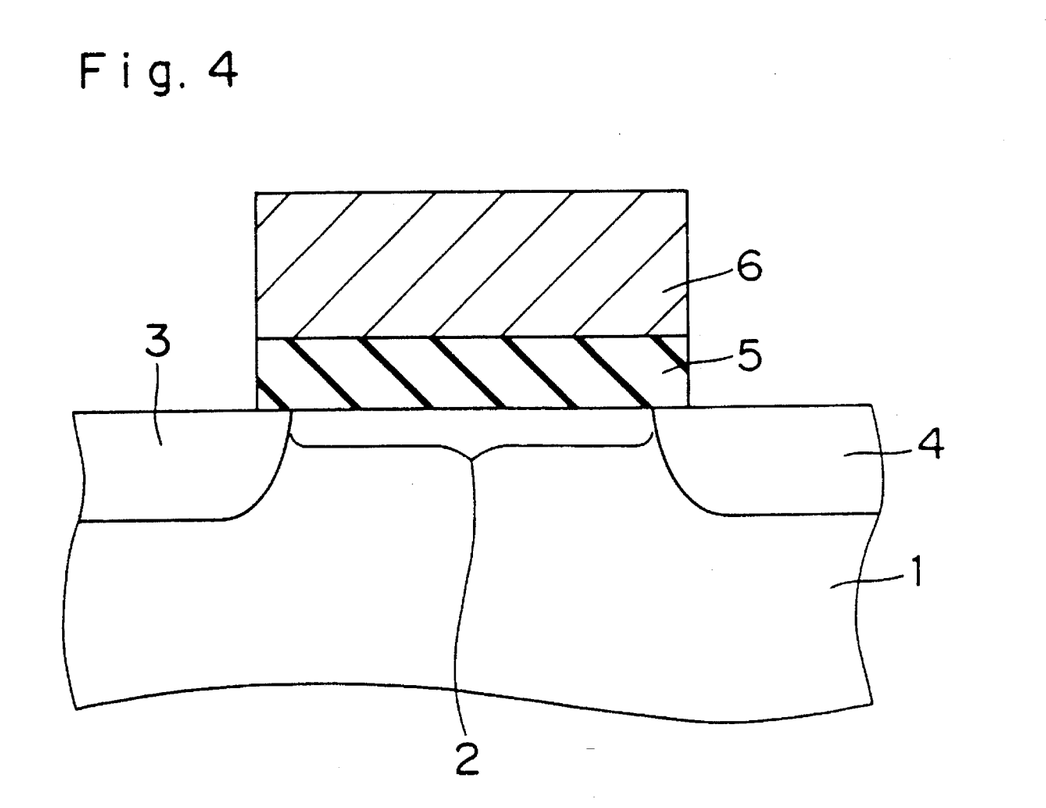
FIG. 4 is a sectional view of a MFSFET.

FIG. 4 is a sectional view illustrating the configuration of an MFSFET used for storing the information "1" or "0". Close to the surface of a P-type semiconductor substrate 1, an $N^+$-type drain region 3 and an $N^+$-type source region 4 are formed at a certain interval. The region between the drain region 3 and the source region 4 acts as a channel region 2. On the channel region 2, a gate electrode 6 is provided with a ferroelectric gate film 5 sandwiched between them.

Figure 5:
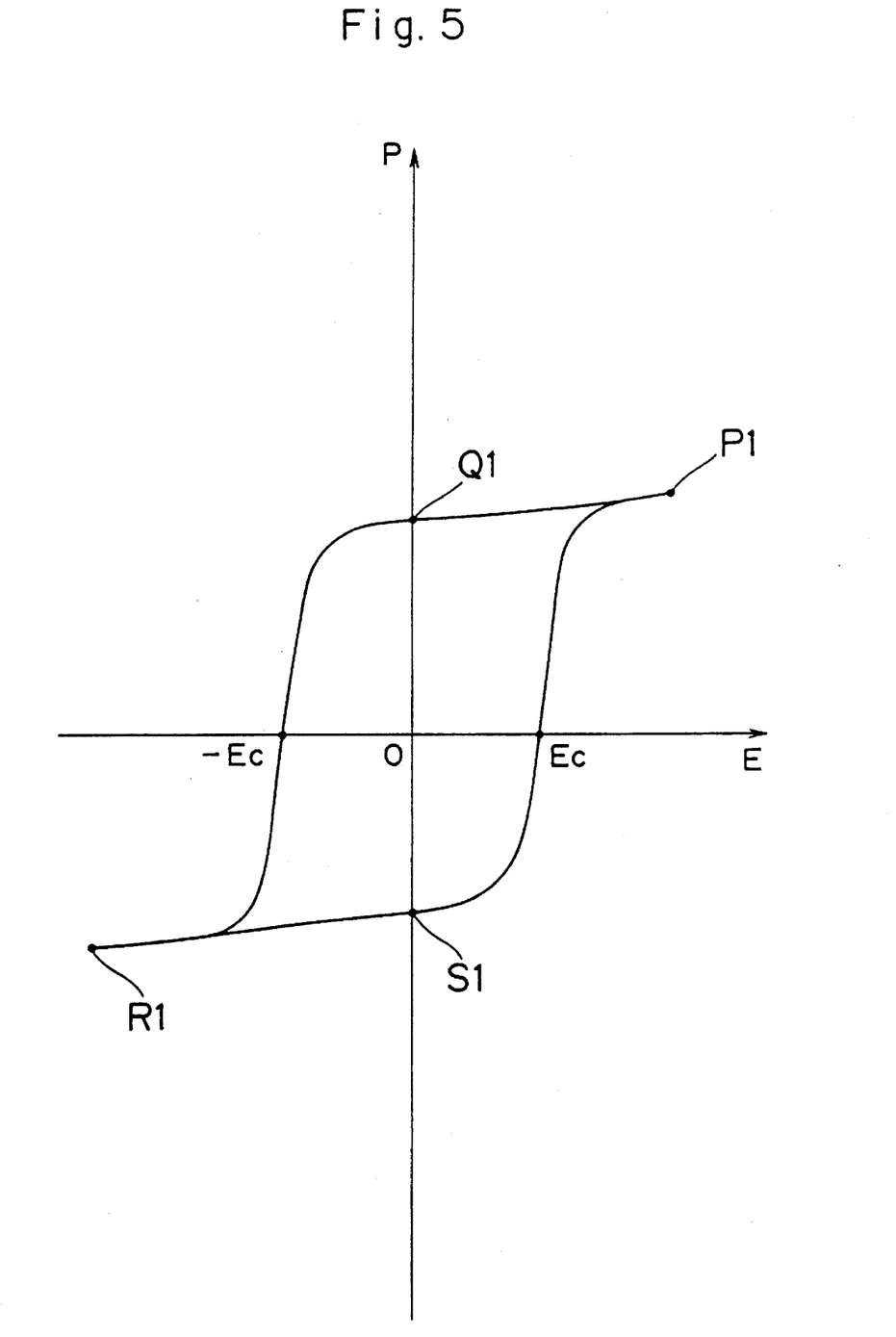
FIG. 5 is a graph representing the hysteresis characteristic of polarization in ferroelectric material, related to an electric field.

FIG. 5 is a graph illustrating a hysteresis loop of a polarization P in ferroelectric material related to an electric field E. In FIG. 5, the vertical axis represents the polarization P while the horizontal axis represents the electric field E. With reference to the P-E hysteresis loop, the theory of writing, erasing or reading information in or from the MFSFET in FIG. 4 will now be described.

In writing the information "1" in the MFSFET, ground potential is applied to the substrate 1, and a programming voltage sufficiently larger than the coercive voltage is applied to the gate electrode 6. "Coercive voltage" means a voltage to obtain a coercive electric field Ec required to remove a residual polarization from the ferroelectric material. In this situation, the ferroelectric gate film 5 is polarized along an electric field applied between the gate electrode 6 and the substrate 1, assuming a state at point P1 in FIG. 5. This causes electrons to be induced to and around the surface of the channel region 2, and consequently, a channel electrically connecting the drain region 3 and the source region 4 is formed. After that, when the programming voltage is removed, the polarization in the ferroelectric gate film 5 exhibits a state at point Q1 in FIG. 5; that is, the polarization stays almost unchanged with the channel left as it was. This is a condition where the information "1" is stored in the MFSFET.

In erasing the information "1" from the MFSFET, or otherwise storing the information "0" therein, contrary to the writing operation, the ground potential is applied to the substrate 1 while a negative programming voltage sufficiently larger in absolute value than the coercive voltage is applied to the gate electrode 6. At this time, an electric field almost a reversal to that which is applied in the writing, is applied to the ferroelectric gate film 5. This application of the electric field causes the polarization in the ferroelectric gate film 5 to invert into a state at point R1. After that, when the programming voltage is eliminated, the polarization in the ferroelectric gate film 5 varies into a state at point S1; that is, the previous state of the polarization is retained almost unchanged. This causes holes to be induced in the surface of the channel region 2, and therefore, the drain region 3 and the source region 4 stay electrically disconnected. This is the condition where the information "0" is stored in the MFSFET.

The information stored in the MFSFET can be read by examining whether the drain region 3 and the source region 4 are electrically connected or disconnected. For example, current is first supplied to the source region 4, and thereafter, by examining if this current can be detected in the drain region 3, the information stored can be identified as "1" or "0".

Figure 6A:
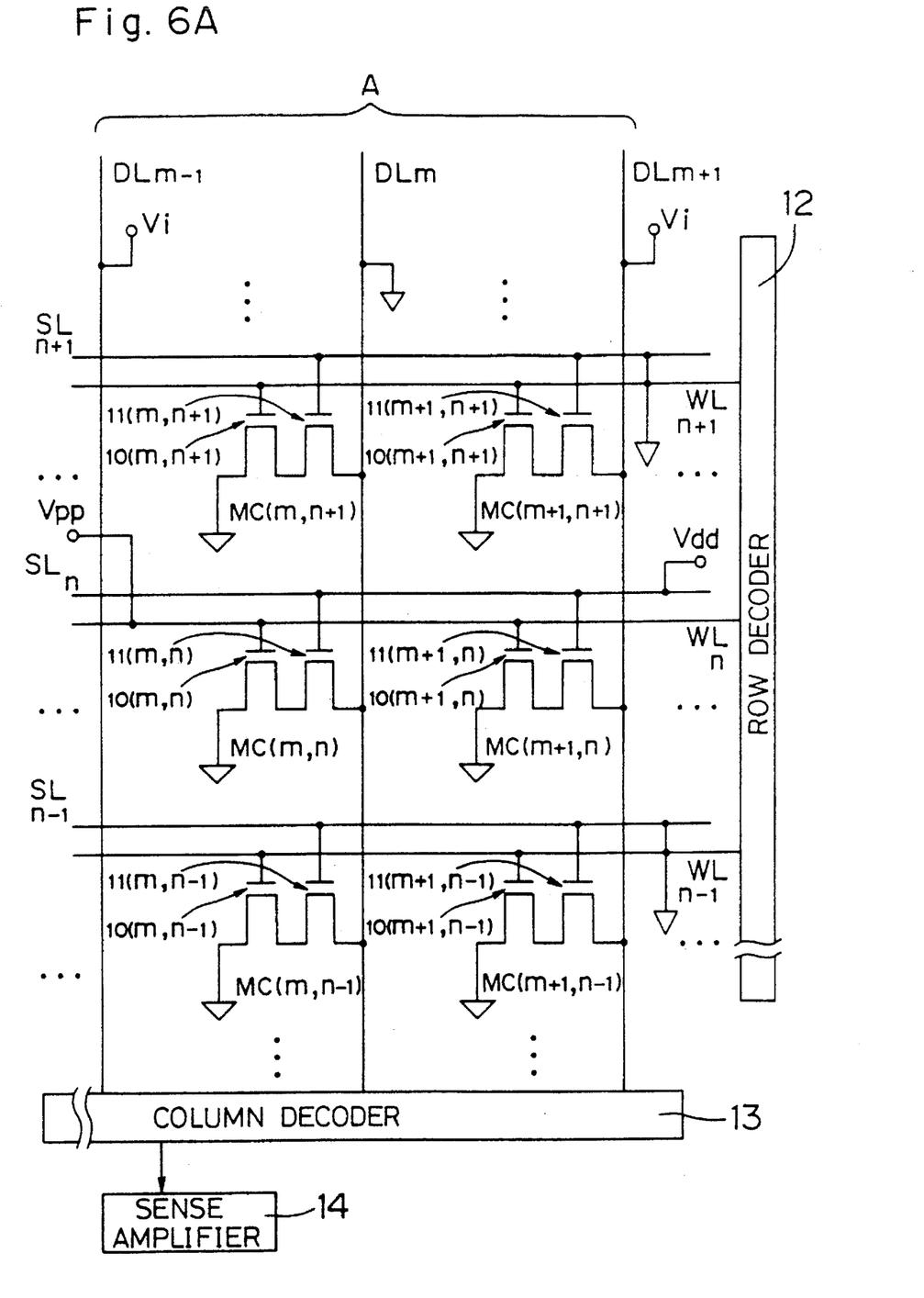
FIGS. 6A to 6C are circuit diagrams helpful for explaining the operation of a nonvolatile memory device where the MFSFET shown in FIG. 4 is utilized.

FIG. 6A is a circuit diagram showing a nonvolatile memory where MFSFETs are utilized. The nonvolatile memory includes a memory cell array A where memory cells MC(m, n–1), MC(m, n), MC(m, n+1), MC(m+1, n–1), MC(M+1, n), MC(m+1, n+1) and so forth, are arranged in a matrix manner on a semiconductor substrate, and each cell can store binary data. Each of the memory cells MC(m, n–1), MC(m, n), MC(m, n+1), MC(m+1, n–1), MC(m+1, n), MC(m+1, n+1) and so forth, is formed of a couple of FETs, namely, one of information storing MFSFETs 10(m, n–1), 10(m, n), 10(m, n+1), 10(m+1, n–1), 10(m+1, n), 10(m+1, n+1) and so forth, mated with a corresponding one of MOSFETs (Metal Oxide Semiconductor Field Effect Transistors) 11(m, n–1), 11(m, n), 11(m, n+1), 11(m+1, n–1), 11(m+1, n), 11(m+1, n+1) and so forth. Hereinafter, the memory cells MC(m, n–1), MC(m, n), MC(m, n+1), MC(m+1, n–1), MC(m+1, n), MC(m+1, n+1) and so forth, are referred to as "memory cell(s) MC" en bloc, the MFSFETs 10(m, n–1), 10(m, n), 10(m, n+1), 10(m+1, n–1), 10(m+1, n), 10(m+1, n+1) and so forth, are referred to as "MFSFET(s) 10" en bloc, and MOSFETs 11(m, n–1), 11(m, n), 11(m, n+1), 11(m+1, n–1), 11(m+1, n), 11(m+1, n+1) and so forth, are referred to as "MOSFET(s) 11" en bloc.

Each MFSFET 10 has its drain connected to the source of the corresponding MOSFET 11. Rows of the MFSFETs 10 have their respective gates connected to a row decoder 12 via common word lines WLn–1, WLn, WLn+1 and so forth. Rows of the MOSFETs 11 have their respective gates connected to common selection control lines SLn–1, SLn, SLn+1 and so forth. Furthermore, columns of the MOSFETs 11 have their respective drains connected to a column decoder 13 via common data lines DLm–1, DLm, DLm+1 and so forth. Reference numeral 14 designates a sense amplifier.

Referring to FIG. 6A, the writing of information in the memory cell MC(m, n) alone will now be described.

In order to write information merely in the memory cell MC(m, n), it is necessary to apply a programming voltage $V_{pp}$ sufficiently larger than the coercive voltage only between the gate and drain of the MFSFET 10(m, n). For that purpose, the programming voltage $V_{pp}$ is applied to the word line WLn alone by the row decoder 12, voltage $V_{dd}$ at a fixed level which allows the MOSFETs 11 to turn on is applied to the selection control line SLn alone, and ground potential (equivalent to the potential of the semiconductor substrate) is applied to the data line DLm. Programming inhibiting voltage $V_i(\approx v_{pp}/2)$ is applied to all the data lines DLm–1, DLm+1 and so forth, but the data line DLm. This causes the ferroelectric gate film in the MFSFET 10(m, n) to be polarized in a direction from its gate electrode towards the semiconductor substrate. In this way, the information "1" is written in the memory cell MC(m, n).

Figure 6B:
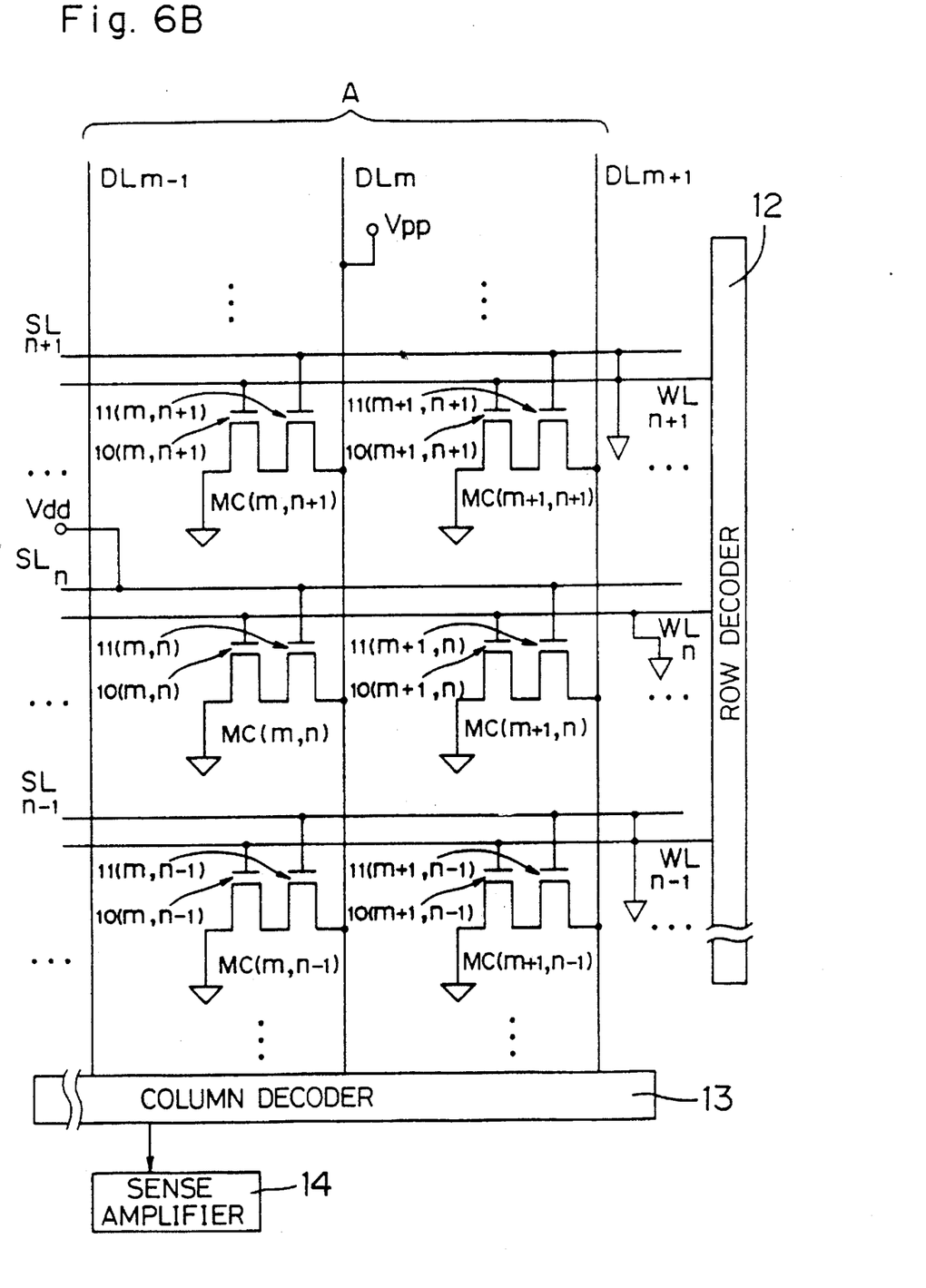

Then, the erasing of the information "1" alone from the memory cell MC(m, n), or the storing of the information "0" therein, will be described with reference to FIG. 6B. The arrangement of the memory cell array A and other components shown in FIG. 6B is similar to that of FIG. 6A.

In order to erase the information "1" from only the memory cell MC(m, n), a voltage reverse to that used in writing must be applied only between the gate and drain of the MFSFET 10(m, n). For that purpose, the programming voltage $V_{pp}$ is applied only to the data line DLm, and the voltage $V_{dd}$ is applied only to the selection control line SLn. Then, ground potential equivalent to that at the substrate is applied to all the word lines WLn–1, WLn, WLn+1, and so forth. This causes the direction of the polarization in the ferroelectric gate film to be inverted. In this way, the information stored in the memory cell MC(m, n) is loaded with "0" instead of "1", and thus, the erasing of the information "1" is effected.

Figure 6C:
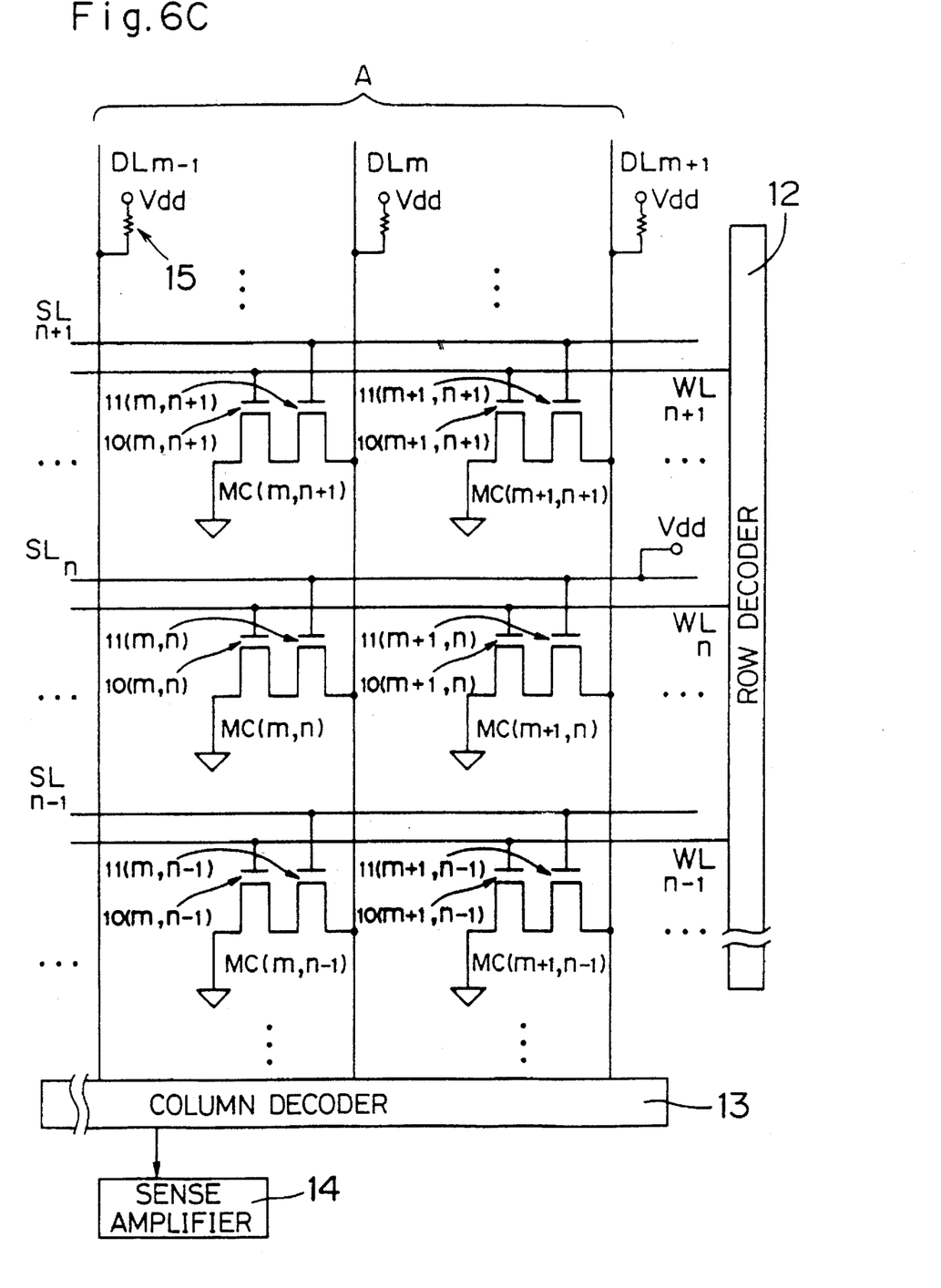

Next, the reading of merely the information stored in the memory cell MC(m, n) will be explained with reference to FIG. 6C. The arrangement of the memory cell array A and other components shown in FIG. 6C is similar to that of FIG. 6A.

In reading merely the information stored in the memory cell MC(m, n), voltage at a fixed level is applied between the source and drain of the MFSFET 10(m, n). In this situation, by examining if current flows between the source and drain, or if a channel is formed, the information "1" or "0" can be identified in reading.

More specifically, the voltage $V_{dd}$ is applied only to the selection control line SLn, and the voltage $V_{dd}$ is applied via a resistance 15 to the data lines DLm–1, DLm, DLm+1, and so forth. The ground potential is applied to the source of the MFSFET 10(m, n). Accordingly, the MOSFET 11(m, n) turns on, and there exists a potential difference of $V_{dd}$ between the source and drain of the MFSFET 10(m, n). If the memory cell MC(m, n) is loaded with the information "1", a channel is formed between the source and drain of the MFSFET 10(m, n). This allows current to flow from the data line DLm into the MOSFET 11(m, n) and the MFSFET 10(m, n). This current causes a voltage drop across the resistance 15, and accordingly, the potential at the data line DLm drops to the level of the ground potential.

If the memory cell MC(m, n) is loaded with the information "0", no channel extends between the source and drain in the MFSFET 10(m, n). In this situation, no current flows into the data line DLm, and no voltage drop arises in the resistance 15. Thus, the potential at the data line DLm is retained at the level of $V_{dd}$.

The column decoder 13 applies only the potential at the data line DLm to the sense amplifier 14, which, in turn, amplifies the potential at the data line DLm, and detects the resultant potential. In this way, the reading of data stored in the memory cell MC(m, n) is effected.

If the column decoder 13 selects any data line one after another, data can be sequentially read from the memory cells MC(m, n), MC(m+1, n) and so forth arranged in a row. Moreover, if a sense amplifier is provided for each of the data lines, data can be read at one time in parallel from all memory cells MC(m, n), MC(m+1, n) and so forth arranged in a row.

In recent years, as the semiconductor industry has increasingly advanced, demand for enhanced integration of nonvolatile memories has increased. As a reaction to this, there may be proposed an enhancement of integration of a memory cell array. As to the memory cell array as shown in FIGS. 6A to 6C, however, it contains two transistors per cell, and such a memory cell array is not suitable for enhancement of the integration.

Figure 7:
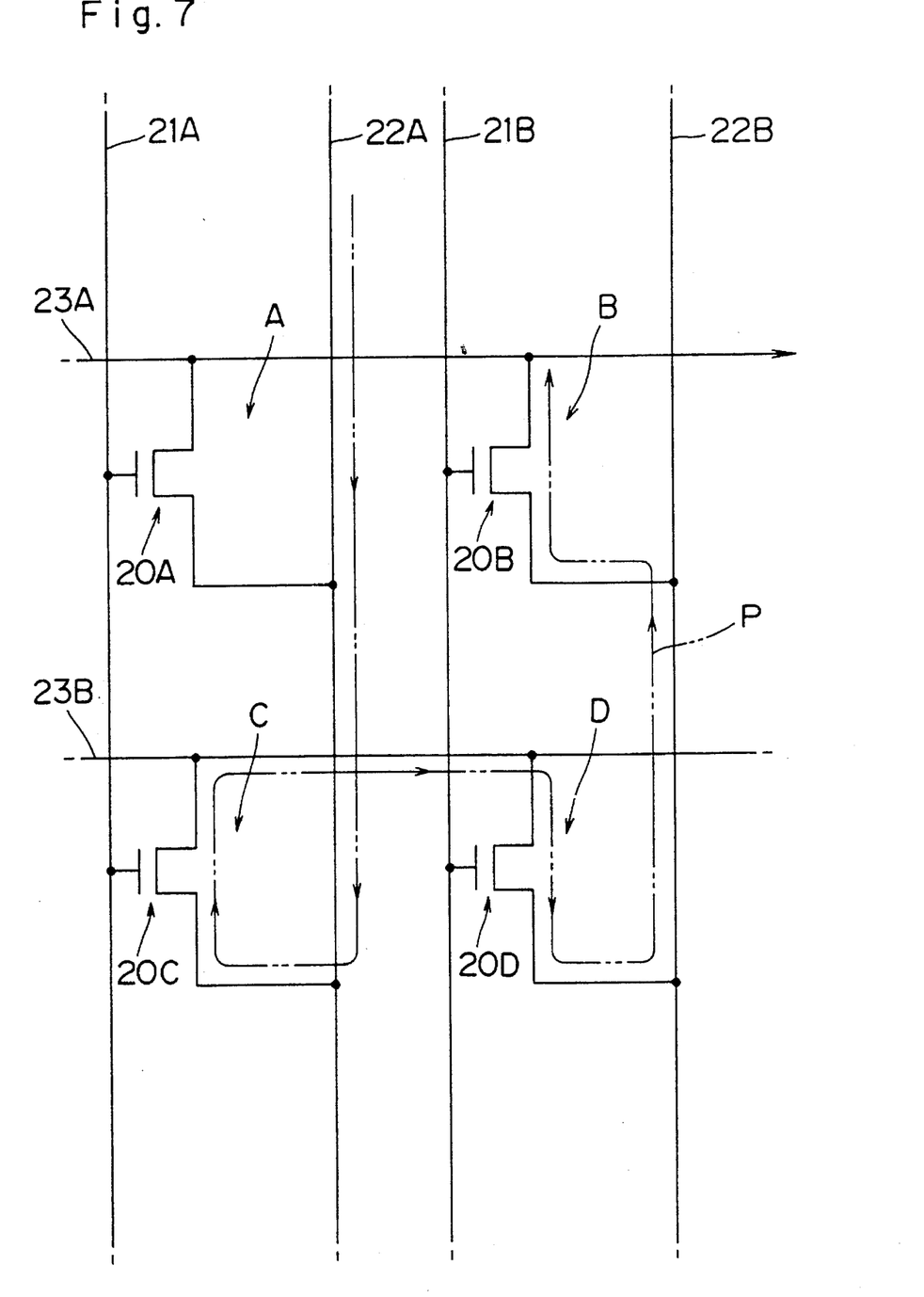
FIG. 7 is a circuit diagram showing a nonvolatile memory device having a configuration where a single cell has a single transistor.

Then proposed is a memory integrated circuit having a configuration where a single cell has a single transistor, as shown in FIG. 7. In such a memory cell array, memory cells A, B, C, D and so forth, arranged in a matrix manner, include respective MFSFETs 20A, 20B, 20C, 20D and so forth. The MFSFETs 20A, 20B, 20C, 20D and so forth, have their respective gates connected to word lines 21A, 21B and so forth, their respective sources connected to data lines 22A, 22B and so forth, and their respective drains connected to drain lines 23A, 23B and so forth.

When information stored in the memory cell A is read, for example, ground potential is applied to all the word lines 21A, 21B and so forth, and current is supplied only to the data line 22A. Furthermore, the ground potential is applied to the drain line 23A, and a potential identical to that at the data line 22A is applied to the remaining drain lines 23B and so forth. In this situation, it can be judged whether the MFSFET 20A is loaded with information "1" or "0" depending upon if the potential at the data line 22A drops; since the MFSFET 20A is in its ON-state when the MFSFET 20A stores the information "1", the potential at the data line 22A drops. In contrast, since the MFSFET 20A is in its OFF-state when the MFSFET 20A stores the information "0", the potential at the data line 22A does not drop.

In the case where the memory cell A stores the information "0" while the remaining memory cells B, C and D respectively store the information "1", i.e., the MFSFET 20A is in its OFF-state while the remaining MFSFETs 20B, 20C and 20D, are in the ON-state, the potential at the data line 22A drops regardless of whether the memory cell A is loaded with the information "0". This is because, in such a condition, the data line 22A is electrically connected through a path P to the drain line 23A to which the ground potential is applied. Thus, the current supplied to the data line 22A flows as leakage current though the path P into the drain line 23A, and eventually, the potential at the data line 22A drops.

As has been described, there arises the problem that the arrangement shown in FIG. 7 is unable to reliably perform the reading operation.

SUMMARY OF THE INVENTION

A general object of the present invention is to overcome the above-mentioned technical disadvantage and provide a nonvolatile memory device in which the reading of stored data can be assuredly performed, and a method for making such a memory device.

Another object of the present invention is to provide a nonvolatile memory device with enhanced density, and a method for making such a memory device.

A nonvolatile memory device according to the present invention includes a field effect transistor used for storage and having a ferroelectric gate film, and a Schottky diode connected in a series with the field effect transistor. The field effect transistor used for storage, for example, turns on when the polarization in the ferroelectric gate film is in a first direction, while it turns off when the polarization is in a second direction reverse to the first direction.

Reading is performed in the manner as follows: Information stored is identified by examining if the field effect transistor used for storage turns on when applying a reading voltage, at a specified level which allows the Schottky diode to turn on, to a serial circuit consisting of the field effect transistor and the Schottky diode.

Even if a voltage is applied to the serial circuit when reading is undesired, the voltage is interrupted by the Schottky diode, and therefore, no undesirable reading of information is performed. As previously mentioned, with a single field effect transistor, information can be stored, and moreover, such information can be read with assurance. Hence, the present invention advantageously brings about an enhanced integration density of a nonvolatile memory device.

Such a field effect transistor used for storage is, for example, obtained by forming a source impurity region and a drain impurity region at a certain interval in a semiconductor substrate, defining a channel region therebetween, and providing a gate electrode above the channel region with a ferroelectric gate film sandwiched therebetween. In such a case, a Schottky diode can be formed by Schottky contact between either the source or drain impurity region in the field effect transistor and a barrier conductive material such as a barrier metal, for example.

Employing the above-mentioned technique, impurity regions acting as source and drain regions can be formed shallower, compared with a case where a PN junction diode is formed in an impurity region. This is helpful for enhancing integration of a device.

These and other objects, features, advantages and effects of the present invention will become more fully apparent from the following detailed description of the preferred embodiments when taken in conjunction with the accompanying drawings.

DESCRIPTION OF THE PREFERRED EMBODIMENTS

Figure 1:
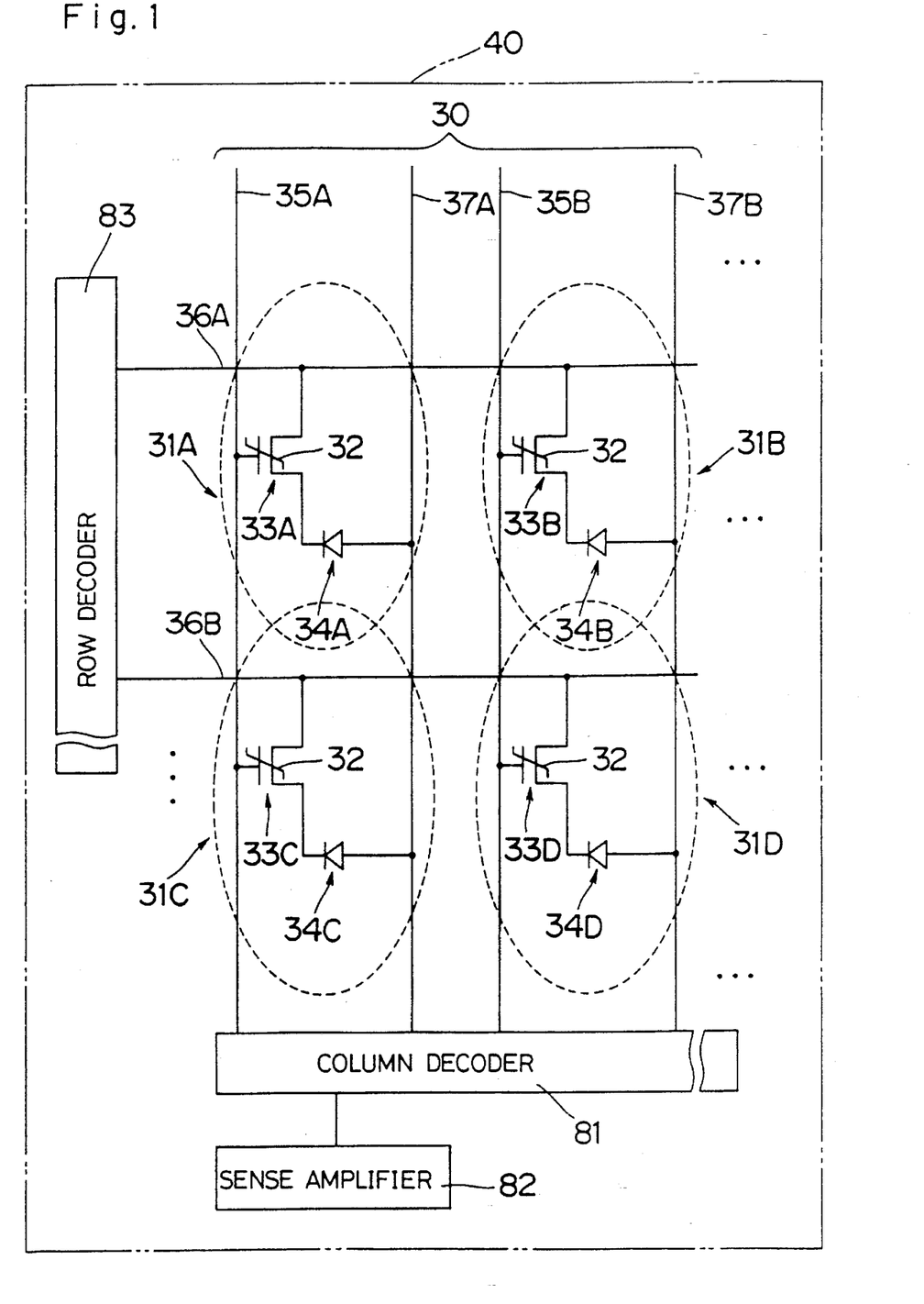
FIG. 1 is a circuit diagram showing the arrangement of a nonvolatile memory device in accordance with a first preferred embodiment of the present invention.

FIG. 1 depicts electric circuitry in a nonvolatile memory device of a preferred embodiment according to the present invention. The nonvolatile memory device includes a memory cell array 30 disposed on a semiconductor substrate 40. The memory cell array 30 includes a plurality of nonvolatile memory cells 31A, 31B, 31C, 31D and so forth, arranged in a matrix manner on the semiconductor substrate 40. The nonvolatile memory cells 31A, 31B, 31C, 31D and so forth, are referred to as "nonvolatile memory cells(s) 31" en bloc hereinafter.

FIG. 1 shows only four of the nonvolatile memory cells 31 although, in practice, there are approximately 4096 of the nonvolatile memory cells 31 arranged on the semiconductor substrate 40.

The nonvolatile memory cells 31A, 31B, 31C, 31D and so forth, are comprised of their respective field effect transistors 33A, 33B, 33C, 33D and so forth (referred to as "MFSFET"—Metal Ferroelectric Semiconductor Field Effect Transistor hereinafter) having a ferroelectric gate film 32, and respective Schottky diodes 34A, 34B, 34C, 34D and so forth, each of the MFSFETs being connected in series to the corresponding one of the Schottky diodes. Hereinafter, the MFSFETs 33A, 33B, 33C, 33D and so forth, are referred to as "MFSFET(s) 33" en bloc while the Schottky diodes 34A, 34B, 34C, 34D and so forth, are referred to as "Schottky diode(s) 34" en bloc.

The MFSFETs 33 utilize residual polarization, which is a characteristic of ferroelectric material, to store information in a nonvolatile manner. Two sorts of information can be stored in a nonvolatile manner by varying the state of polarization in the ferroelectric gate film 32. With MFSFETs 33 of the N channel type, for example, each of the MFSFETs 33 turns on if the ferroelectric gate film 32 is polarized with its part close to the gate electrode being of negative polarity.

The MFSFET 33 turns off if the ferroelectric gate film 32 is polarized with its part close to the gate electrode being of positive polarity. The ON-state of the MFSFET 33 corresponds to a condition where the information "1" is stored while the OFF-state of the MFSFET 33 corresponds to a condition where the information "0" is stored. The relations of ON/OFF of the MFSFET 33 to the stored information "1"/"0" may be reversed.

The MFSFETs 33 in the memory cells 31 aligned in one direction have their respective gates connected to a common word line such as word lines 35A, 35B and so forth. The MFSFETs 33 in the memory cells 31 aligned in a direction orthogonal to the word lines 35A, 35B and so forth, have their respective drains connected to a common data line such as 36A, 36B and so forth. The MFSFETs 33 in the memory cells 31 aligned along the word line such as word lines 35A, 35B and so forth, have their respective sources connected via the Schottky diodes 34 to a source line such as source lines 37A, 37B and so forth, where the Schottky diodes have their cathodes connected to the sources of the MFSFETs 33 and their anodes connected to the source line.

The word lines 35A, 35B and so forth, and the source lines 37A, 37B and so forth, are connected to a column decoder 81, and in writing, reading or erasing information, appropriate voltage is applied by the column decoder 81. The column decoder 81 is connected to a sense amplifier 82 to which it, in reading information, inputs a potential at the source line 37 connected to the specified memory cell 31 from which information is to be read. The sense amplifier 82 amplifies the received potential to produce a signal corresponding to the data stored in the memory cell 31 from which information is to be read.

On the other hand, the data lines 36A, 36B and so forth, are connected to a row decoder 83 which applies appropriate voltage to each of the data lines 36A, 36B and so forth, in writing, reading or erasing information.

The writing, reading and erasing of information in or from the nonvolatile memory will be described below. For convenience, it is now assumed that the memory cell 31A is selected as a sample.

<Writing>

In writing information, the column decoder 81 applies a voltage $V_{pp}$ (e.g., 20V) sufficient to polarize the ferroelectric gate film 32 of each MFSFET 33 to the word line 35A to which the memory cell 31 is connected and it also applies a voltage of $V_{pp}/2$ to the remaining word lines 35B and so forth. The value $V_{pp}/2$) is, however, less than the coercive voltage. The column decoder 81 further applies the ground potential to the source lines 37A, 37B and so forth. The row decoder 83 applies the ground potential to the data line 36A to which the memory cell 31A is connected and it also applies a programming inhibiting voltage $V_i(\approx V_{pp}/2$, e.g., 10v) to the remaining data lines 36B and so forth.

In the memory cell 31A in this situation, the programming voltage $V_{pp}$ is applied between the gate and drain of the MFSFET 33A. This causes a sufficient electric field to be applied to the ferroelectric gate film 32 in the direction from the gate electrode towards the semiconductor substrate 40, and the ferroelectric gate film 32 is polarized along the direction of the electric field. Consequently, the MFSFET 33A turns on, and the writing of information "1" is attained.

In memory cell 31B, however, the voltage $V_{pp}/2$ (lower than the coercive voltage) is applied to the gate of the MFSFET 33B, and the ground potential is applied to its drain. Thus, there is no change in the direction of the polarization in the ferroelectric gate film 32, and this means there is no change in information stored in the memory cell 31B.

In the memory cell 31C, the programming voltage $V_{pp}$ is applied to the gate of the MFSFET 33C while the programming inhibiting voltage $V_i$ is applied to its drain. This causes merely an electric field corresponding to $(V_{pp}-V_i)$ to be applied to the ferroelectric gate film 32. Thus, there is no change in the information stored in the memory cell 31C.

In the memory cell 31D, the voltage $V_{pp}/2$ is applied to the gate of the MFSFET 33D while the programming inhibiting voltage $V_i$ is applied to its drain. Thus, the polarization in the ferroelectric gate film 32 of the MFSFET 33D is not changed, and the information stored in the memory cell 31D remains unchanged.

<Reading>

In reading information, the column decoder 81 applies a voltage SA lower than the coercive voltage to the source line 37A to which the memory cell 31A is connected, so as to supply current. The ground potential is applied to the remaining source lines 37B and so forth. The row decoder 83 applies the ground potential to the data line 36A to which the memory cell 31A is connected and it also applies the voltage SA identical to that which is applied to the source line 37A, to the data lines 36B and so forth, to which the memory cell 31A is not connected. Moreover, the column decoder 81 forces the word lines 35A, 35B and so forth, to be in a floating state. The column decoder 81 further applies to the sense amplifier 82 the potential at the source line 37A connected to the memory cell 31A.

If the memory cell 31A is loaded with the information "1", the MFSFET 33A is its ON-state. Thus, the potential at the source line 37A drops down from SA to the ground potential. If the memory cell 31A is loaded with the information "0", the MFSFET 33A is in its OFF-state. Thus, the potential at the source line 37A does not drop. Eventually, an output signal from the sense amplifier 82 which amplifies and outputs a potential at the source line 37A corresponds to the information stored in the memory cell 31A.

As previously mentioned, the Schottky diodes 34 are positioned between the sources of the MFSFETs 33 and the source lines 37A, 37B. When the voltages as stated above are applied to the data lines 36A, 36B and so forth, and the source lines 37A, 37B and so forth, forward voltage sufficient to turn on the Schottky diodes 34B, 34C, 34D and so forth, is not applied to them in the memory cells 31B, 31C, 31D and so forth, other than the memory cell 31A. Thus since the Schottky diodes 34B, 34C, 34D and so forth, interrupt leakage current, information stored in the memory cells 31B, 31C, 31D and so forth, is never erroneously read.

<Erasing>

The erasing of information is executed for all the memory cells in each word line together. For example, the column decoder 81 applies an erasing voltage $-V_{pp}$ different in polarity from the voltage used in the writing to the word line 35A to which the memory cell 31A is connected, and is also applies the ground potential to the remaining word lines 35B and so forth. Furthermore, the column decoder 81 applies the ground potential to all the source lines 37A, 37B and so forth. The row decoder 83 applies the ground potential to all the data lines 36A, 36B and so forth. In this way, information stored in all the memory cells 31A, 31C and so forth, connected to the word line 35A is erased.

Figure 2:
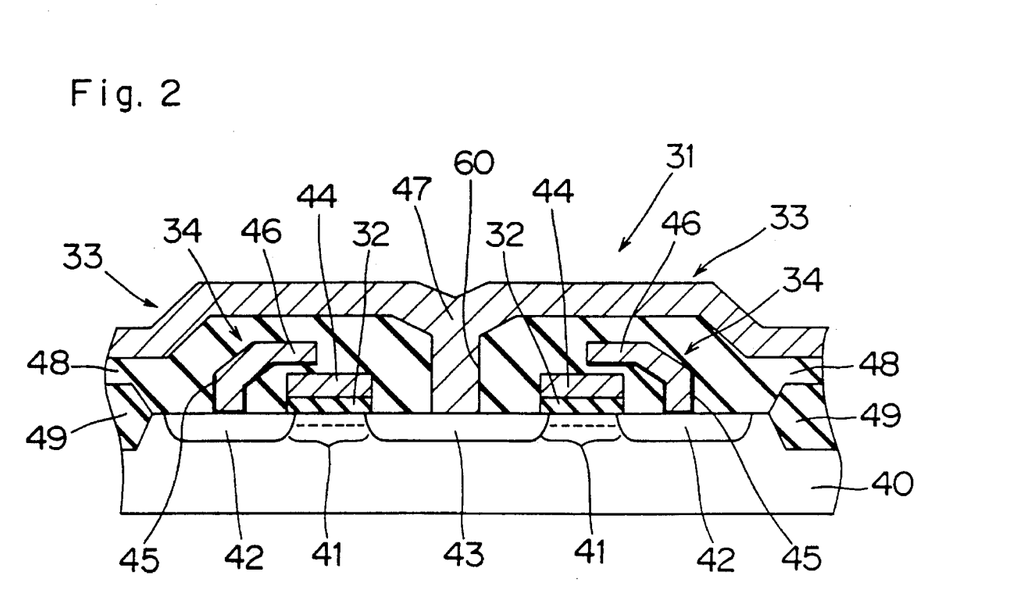
FIG. 2 is a sectional view showing part of the nonvolatile memory device.

FIG. 2 is a sectional view of the nonvolatile memory cell 31. In the P-type semiconductor substrate 40, an $N^+$-type source region 42 and an $N^+$-type drain region 43 are formed with a channel region 41 interposed between them. On the channel region 41, a gate electrode 44 is provided with a ferroelectric gate insulating film 32 (hereafter called simply a ferroelectric gate film) interposed therebetween. The foregoing is the configuration of the MFSFET 33. A conductive barrier material 45 such as a barrier metal is in Schottky contact with the source region 42 of the MFSFET 33. Each of the Schottky diodes is configured in this manner.

Reference numerals 46, 47, 48 and 49 denote a source wiring layer, and a drain electrode wiring layer, a layer insulating film, and a field oxide film, respectively. The source wiring layer 46 is formed on the barrier metal 45. The drain electrode wiring layer 47 is formed on the layer insulating film 48 and comes in contact with the drain region 43 in a contact hole 60.

It also is possible to fabricate a PN junction diode by further diffusing P-type impurity within the $N^+$-type source region 42. If such a design is employed, however, the diffusion layer for the source region must be made deeper, and this prevents an enhancement of the integration of the device. The reason is that, making the diffusion layer for the source region insufficient in depth might cause the PN junction within the source region to electrically connect with the semiconductor substrate or a well.

In the nonvolatile memory cell according to the present invention, however, the Schottky diode 34 is configured in such a manner that the conductive barrier materiel 45 is in contact with the source region 42 of the MFSFET 33, and therefore, the depth of the impurity diffused layer for the source and drain regions 42, 43 can be reduced. Thus, the integration of the nonvolatile memory device can be effectively performed.

Figure 3A:
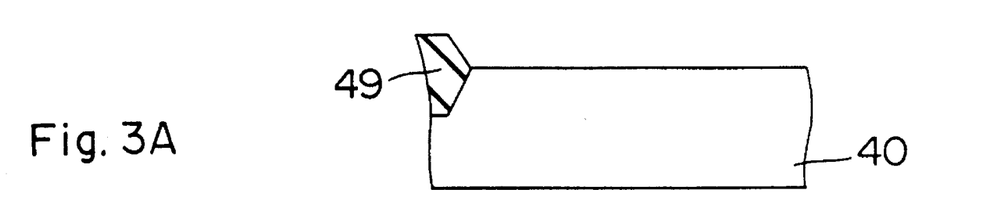
FIGS. 3A to 3K are sectional views illustrating steps of manufacturing the nonvolatile memory device in order.

A method of manufacturing the nonvolatile memory cell will now be described with reference to FIGS. 3A to 3K. FIGS. 3A to 3K are sectional views illustrating steps of the nonvolatile memory cell manufacturing method in the process order. First, as shown in FIG. 3A, a field oxide film 49 is formed on the P-type semiconductor substrate 40.

Figure 3B:
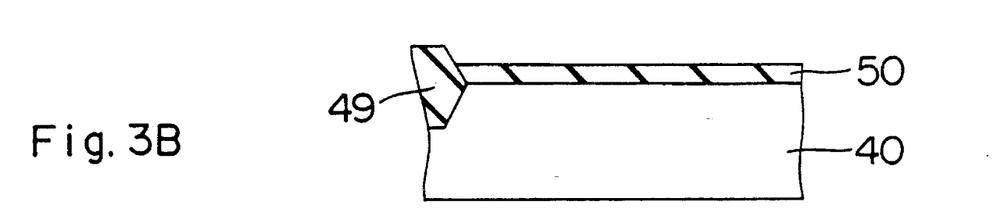

Then, after a layer of ferroelectric material 50 such as $PbTiO_3$ or the like is deposited on the semiconductor substrate 40 by means of high frequency sputtering as shown in FIG. 3B, a thermal treatment is carried out for several hours. The high frequency sputtering may be performed under the following conditions, for example: The radius of the target is 80 nm; the space of the target substrate is 35 nm; target RP voltage is 1.6 kV; the sputtering power is 150 W; the sputtering gas is a mixed gas of Ar and $O_2$ mixed at a ratio of 9:1; the gas pressure is $2 \times 10^{-2}$ Torr; the temperature of the substrate is 400° to 500° C.; and the sputtering rate is 3 nm/minute. At the same time, the target must get compensation of lead (of 10 Wt. % and calcined). As to the temperature of the substrate, it may be retained at 400° C. during the sputtering and then at 500° C. during the thermal treatment thereafter.

Figure 3C:
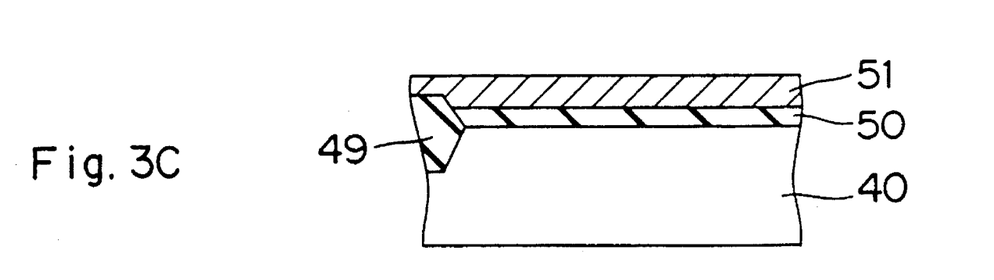

Furthermore, as shown in FIG. 3C, electrode substance 51 such as platinum is deposited on the ferroelectric material 50 by means of sputtering.

Figure 3D:
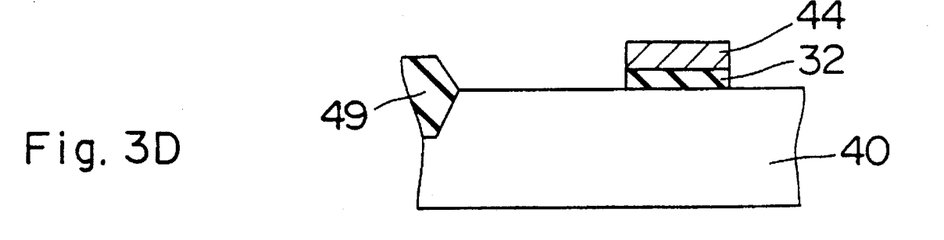

After that, as shown in FIG. 3D, the ferroelectric material 50 and the electrode substance 51 are removed by etching with a mask of resist to form the ferroelectric gate film 32 and the gate electrode 44 for the MFSFET 33 on the semiconductor substrate 40.

Figure 3E:
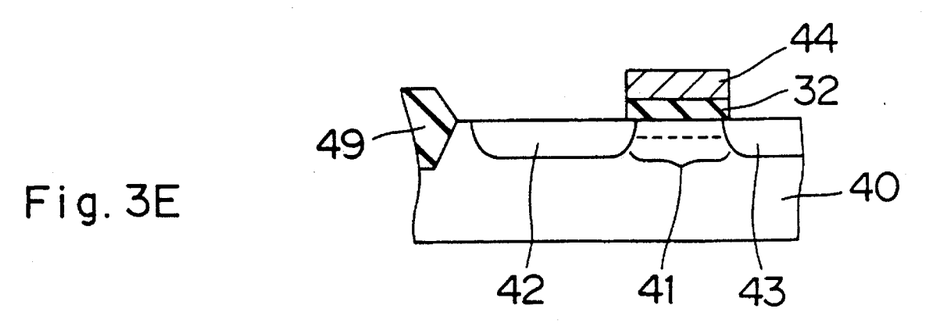

Then, as shown in FIG. 3E, N-type impurity is injected at high concentration into the semiconductor substrate 40, utilizing a self-alignment technique, to form the source region 42 and the drain region 43 in and around the surface of the semiconductor substrate 40. The source region 42 and the drain region 43 together define the channel region 41 therebetween.

Figure 3F:
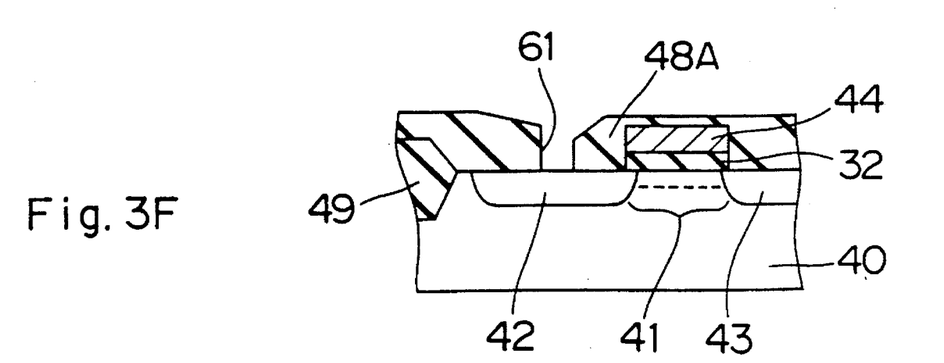

Moreover, as shown in FIG. 3F, a layer insulating film 48A is deposited, and thereafter, a contact hole 61 is formed by etching so that the source region 42 is exposed.

Figure 3G:
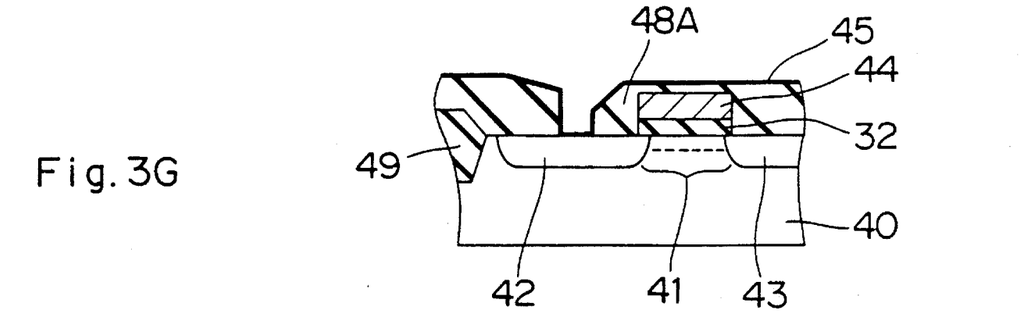

Then, as shown in FIG. 3G, the conductive barrier material 45 is superposed by means of vapor deposition so as to be in contact with source region 42 exposed at the step, shown in FIG. 3F. The conductive barrier material 45 is preferably a refractory material having a high fusing point, for example, a barrier metal having a fusing point of at least about 1660° C. Platinum (Pt) may be employed. Other substances that are suitable for use as conductive barrier material 45 include ruthenium (Ru), titanium (Ti), Iridium (Ir), and iridium dioxide ($IrO_2$). After the conductive barrier material 45 is deposited, the substrate is annealed in a nitrogen containing environment at a low temperature such that the junction between the source region 42 and the barrier material 45 does not make an ohmic contact (e.g., in the vicinity of 600° C.) to form the Schottky diode 34. The thickness of the conductive barrier material 45 is preferably, for example, 50 to 100 nm.

Figure 3H:
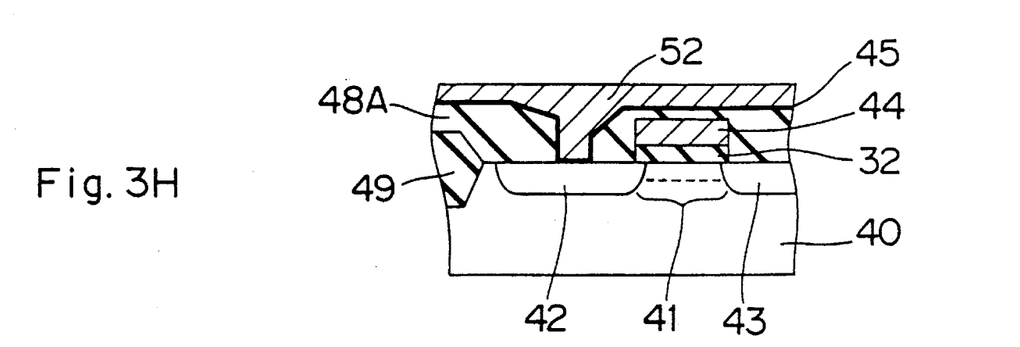

After that, as shown in FIG. 3H, wiring material 52 such as aluminum is deposited on the conductive barrier material 45 by means of sputtering.

Figure 3I:
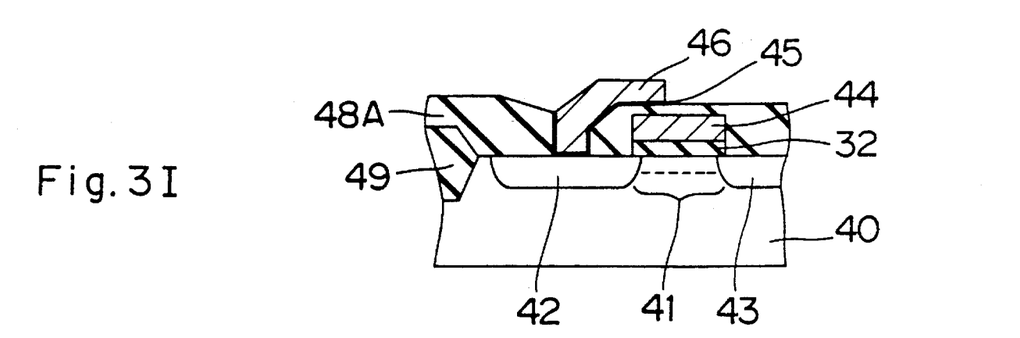

Then, as shown in FIG. 3I, the wiring material 52 is patterned to form the source wiring layer 46. Simultaneously, the conductive barrier material 45 is partially removed together with the wiring material 52.

Figure 3J:
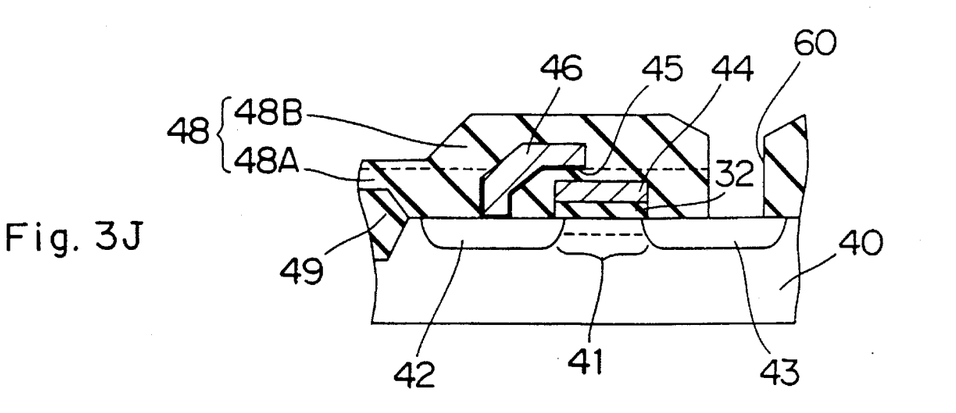

Furthermore, as shown in FIG. 3J, a layer of insulating film 48B is laminated on the layer insulating film 48A, and thereafter, a contact hole 60 is formed by etching so that the drain region 43 is exposed.

Figure 3K:
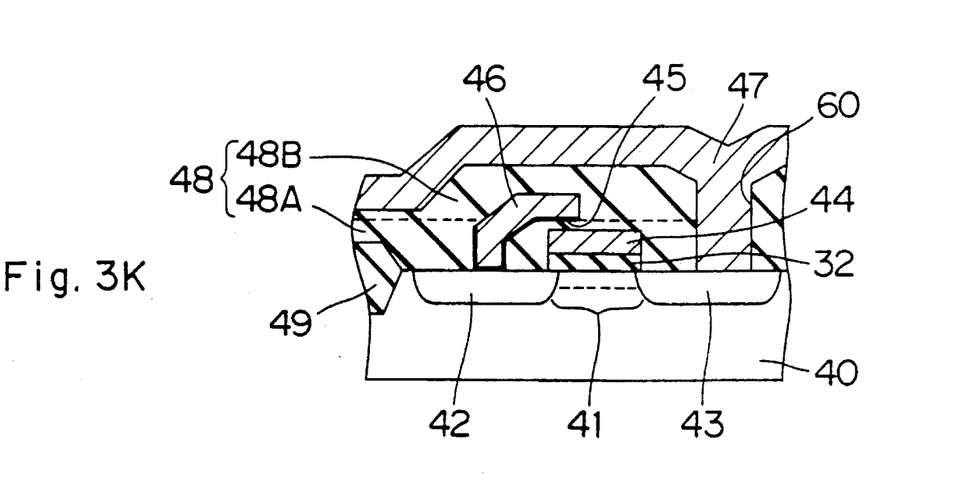

Finally, as shown in FIG. 3K, the drain electrode wiring layer 47 is formed in contact with the drain region 43 exposed at the step shown in FIG. 3J. In this way, the nonvolatile memory cell configured as shown in FIG. 2 can be obtained.

In the method as mentioned above, the temperature in annealing the conductive barrier material 45 is set low to make as little ohmic contact between the barrier material 45 and the source region 42 as possible, so that the conductible barrier material 45 can come into Schottky contact with the source region 42. Thus, a Schottky diode can be formed simultaneous with the formation of the conductive barrier material 45, and hence, the manufacturing process can be simplified.

If the conductive material 45 for the Schottky diode and the source wiring layer 46 are made of the same material, the Schottky diode 34 and the source wiring layer 46 can be formed simultaneously, and therefore, the manufacturing process can be further simplified.

While what are currently deemed preferred embodiments of the present invention have been described, it is not intended that the present invention be limited to those embodiments. In the above embodiments, for example, N Channel MFSFETs are used to constitute the nonvolatile memory cell though P channel MFSFETs may be used instead. Also in the above embodiments, Schottky diodes are positioned between the MFSFETs and the source lines though they may be placed between the data lines and the MFSFETs.

Although the preferred embodiments of the present invention have been described in detail, it should be understood that the foregoing is by way of example only to set forth the technical subjects of the present invention and that the present invention not be taken by way of limitation to the examples defined by the foregoing. The true spirit and scope of the present invention should be defined only by the appended claims.

What is claimed is:

1. A method of manufacturing a nonvolatile memory device, comprising the steps of:

forming a ferroelectric gate insulating film on a semiconductor substrate;

forming a gate electrode on said ferroelectric gate insulating film;

forming first and second impurity regions in said semiconductor substrate with said gate electrode interposed therebetween to define a region between the first and second impurity regions as a channel region; and forming conductive barrier material in contact with the first impurity region so as to make a Schottky diode.

2. A method of manufacturing a nonvolatile memory device according to claim 1, wherein between said step of forming the first and second impurity regions and said step of making the Schottky diode, the method further comprises the steps of:

forming a first layer insulating film covering surfaces of said gate electrode and said semiconductor substrate; and etching said first layer insulating film to form a first contact hole in such a manner that said first impurity region is exposed;

wherein said conductive barrier material extends into said contact hole.

3. A method of manufacturing a nonvolatile memory device according to claim 2, wherein after said step of making the Schottky diode, the method further comprises the step of forming a first wiring layer on said conductive barrier material.

4. A method of manufacturing a nonvolatile memory device according to claim 3, wherein after said step of forming said first wiring layer, the method further comprises the steps of:

forming a second layer insulating film covering said first wiring layer and said first layer insulating film;

etching the second layer insulating film to form a second contact hole in such a manner that the impurity region is exposed; and forming a second wiring layer in contact with the second impurity region through the second contact hole.

5. A method of manufacturing a nonvolatile memory device according to claim 3, wherein said first wiring layer is formed of the same substance as said conductive barrier material, and said first wiring layer is formed simultaneously with the formation of said conductive barrier material.

6. A method of manufacturing a nonvolatile memory device according to claim 1, wherein said step of making said Schottky diode includes the step of annealing said conductive barrier material at a temperature lower than that which makes an ohmic contact between said conductive barrier material and said first impurity region so that said conductive barrier material comes in Schottky contact with said first impurity region.

7. A method of manufacturing a nonvolatile memory device according to claim 1, wherein said conductive material is a barrier metal having a high fusing point.

8. A method of manufacturing a nonvolatile memory device according to claim 7, wherein the fusing point of the barrier metal is at least about 1660° C.

9. A method of manufacturing a nonvolatile memory device according to claim 1, wherein the conductive barrier material comprises a substance selected from the group consisting of Pt, Ru, Ti, Ir, and $IrO_2$.

* * * * *